(12) United States Patent
Bryan et al.

(10) Patent No.: US 6,232,790 B1
(45) Date of Patent: May 15, 2001

(54) METHOD AND APPARATUS FOR AMPLIFYING ELECTRICAL TEST SIGNALS FROM A MICROMECHANICAL DEVICE

(75) Inventors: Elizabeth Ruth Bryan, Westminster; Murden K. Deadwyler, Placentia; David N. Green, Riverside; James L. Heiertz, Huntington Beach; Hugh Joseph Murphy, Carlsbad, all of CA (US)

(73) Assignee: Honeywell Inc., Morristown, NJ (US)

( * ) Notice: Subject to any disclaimer, the term of this patent is extended or adjusted under 35 U.S.C. 154(b) by 0 days.

(21) Appl. No.: 09/264,836

(22) Filed: Mar. 8, 1999

(51) Int. Cl.[7] .................................................. G01R 31/02
(52) U.S. Cl. .............................................................. 324/754
(58) Field of Search .................................... 324/754–758, 324/765

(56) References Cited

U.S. PATENT DOCUMENTS

| | | | |
|---|---|---|---|
| 3,757,565 | * 9/1973 | Wong | 73/71.4 |
| 4,161,692 | * 7/1979 | Tarzwell | 324/754 |
| 4,780,670 | 10/1988 | Cherry . | |
| 4,853,627 | * 8/1989 | Gleason et al. | 324/754 |
| 4,894,612 | 1/1990 | Drake et al. . | |
| 5,051,689 | 9/1991 | Hiwada et al. . | |
| 5,215,476 | 6/1993 | Rector . | |
| 5,323,107 | * 6/1994 | D'Souza | 324/754 |
| 5,488,862 | 2/1996 | Neukermans et al. . | |
| 5,493,236 | 2/1996 | Ishii et al. . | |

FOREIGN PATENT DOCUMENTS

| | | |
|---|---|---|
| 0 131 375 A1 | 1/1985 | (EP) . |
| WO 91/07667 | 5/1991 | (WO) . |

* cited by examiner

Primary Examiner—Safet Metjahic
Assistant Examiner—Russell M. Kobert
(74) Attorney, Agent, or Firm—Kris T. Fredrick

(57) ABSTRACT

An apparatus and method is provided for testing performance characteristics of a MEMs device. The apparatus includes a test probe that is electrically connected to a mechanical member of the MEMs device for receiving electrical data signals from the MEMs device that are indicative of the movement of the mechanical member due to external excitation. The apparatus also includes communications or transmitting the signals from the test probe and an analyzer for receiving the signals and for analyzing the signals to determine the performance characteristics of the MEMs device. The apparatus a so includes an amplifier connected between the test probe and the communications. The amplifier is placed in close proximity to the test probe such at it amplifies the signals prior to transmission of the signals by the communications. As such, the electrical data signals are amplified before sufficient noise is introduced into the signals to reduce their signal to noise ratio to less than a predetermined level. By amplifying the signals prior to the introduction of significant noise, the signals, which may have relatively small amplitude, are not obscured by the noise.

15 Claims, 3 Drawing Sheets

METHOD AND APPARATUS FOR AMPLIFYING ELECTRICAL TEST SIGNALS FROM A MICROMECHANICAL DEVICE

FIELD OF THE INVENTION

The method and apparatus of the present invention relate generally to testing micromechanical and microelectromechanical devices. More particularly the method and apparatus of the present invention relate to amplifying of electrical data signals received during testing of the devices.

BACKGROUND OF THE INVENTION

In the past few years, many micromechanical and microelectromechanical devices (hereinafter collectively referred to as "MEMs devices") that include mechanical members have been fabricated from silicon or other etchable materials. These MEMs devices are advantageous because they can be made with microfabrication techniques having increased precision, allow for smaller miniaturization, and generally have lower power requirements.

Although the production of MEMs devices having etched mechanical members has been expanding, several manufacturing problems have not yet been adequately addressed. For example, one problem is testing the MEMs devices during manufacture to ensure that the devices provide the desired operational and performance characteristics. It is typically desirous to test MEMs devices at the wafer level so that device quality can be evaluated prior to packaging. Cost and schedule advantages are achieved by wafer probe testing in identifying only good performing devices worthy of investment for assembly, and quantifying device performance at completion of fabrication (thus communicating device characteristics at completion of fabrication, unmasked by further assembly effects). Wafer probe testing requires successful probe contact of die access pads and the electrical excitation and measurement of devices.

Traditionally, MEMs devices have been tested by mechanically exciting the mechanical members and recording the electrical outputs of the MEMs devices. The electrical outputs of the MEMs devices due to the mechanical excitation indicate the level of quality and performance of the MEMs devices.

Testing MEMs devices using mechanical excitation, however, has some disadvantageous limitations. MEMs devices are typically manufactured by forming a group of MEMs devices on one single etchable die or wafer. In typical mechanical excitation procedures, however, the MEMs devices must first be separated from the wafer before they can be individually tested. The separation of the MEMs devices is time consuming, and the resulting individual MEMs devices are typically delicate, small, and thus, tedious to handle during testing. Further, the time expended separating the MEMs devices that are later found to malfunction is essentially wasted. In addition to requiring that the MEMs devices be separated from the wafer before testing, mechanical excitation procedures also require specialized machinery designed to exert several different mechanical forces on the MEMs devices.

To address the problems associated with mechanical excitation of MEMs devices, testing procedures have been implemented that use electrical excitations as opposed to mechanical excitation. These test procedures apply electrical signals to the various mechanical members of the MEMs devices. These electrical signals excite the various mechanical members causing the mechanical members to move similar to the movement caused by mechanical excitation. This movement of the mechanical members produces electrical signals at the output of the MEMs devices. By analyzing the electrical signals output by the MEMs devices, which are indicative of the movement of the mechanical members caused by electrical excitation, the level of quality and performance of the MEMs devices can be determined. Electrical excitation procedures are advantageous since they may be implemented while the MEMs devices are still part of the wafer, i.e., without requiring the MEMs devices to be individually separated from the wafer for testing. As such, time expended for removing MEMs devices that are later determined to be malfunctioning and problems associated with handling of the individual MEMs devices are eliminated if wafer probe testing is accomplished.

However, electrical excitation test procedures may also have problems which hinder efficient testing of MEMs devices. Specifically, electrical excitation of MEMs devices does not create the same level or magnitude of excitation of the mechanical members as does conventional mechanical excitation test procedures. As such, the electrical data signals output by the MEMs devices in response to electrical excitation are much smaller in amplitude. These smaller amplitude signals can make testing the MEMs devices difficult.

For instance, in a typical measurement procedure, the test apparatus uses a test probe that is connected to an output of the MEMs devices. The test probes receive the electrical data signal from the MEMs devices, and the electrical data signal propagates through the test probes, through electrical leads between the various test components, and through electrical wiring, prior to being received at a remote test station for analysis. Due to the relatively small amplitude of the electrical data signals, however, a charge amplifier must be used to amplify the signals. The charge amplifier is a specialized amplifier that converts very small charge signals (i.e., approximately $10^{-17}$ coulombs) to a voltage level sufficient for analysis.

Problems occur due to the introduction of signal noise to the electric data signal as it propagates from the test probe to the remote test station. In this regard, the test probe, component leads, and the electrical wiring on which the data signal propagates are susceptible to the introduction of electrical noise which disadvantageously decreases the signal to noise ratio. Specifically, the test probe, leads and wires are susceptible to the receipt of spurious outside noise signals such as the 60 Hz frequency of a power supply or other electrical noise such as electromagnetic and magnetoelectronic fields.

The electrical data signal output from the MEMs device has a relatively small amplitude compared to the electrical noise signals introduced into the data signal as it propagates along the test probe, component leads, and wiring. As such, the data signal deteriorates and may be obscured by the electrical noise when the electrical data signal is received by the remote test station. Specifically, when the electrical data signal is amplified at the remote location for analysis purposes, the lower amplitude electrical data signal may be obscured by the higher amplitude noise signals that are introduced into the signal as it propagates from the MEMs device to the remote test station, thereby rendering analysis of the electrical data signal virtually impossible.

Additionally, the charge amplifiers used to amplify the electrical data signals are sensitive to electrical noise such as input capacitance and electrical capacitance from spurious signal sources (e.g., 60 Hz power source). Due to the large magnitude of gain supplied by the charge amplifiers and the unique characteristics of the amplifier, the large amplitude electrical noise present on the input of the amplifier is significantly amplified. This amplification of the signal noise further causes the relatively small magnitude electrical data signal from the MEMs device to be obscured by the larger magnitude electrical noise.

While electrical stimulation of the mechanical members of a MEM's device offers numerous advantages during the testing of a MEM's device, the electrical stimulation of the mechanical members have several shortcomings. In particular, the signals received by the test probe that will be subsequently analyzed to determine the performance characteristics of the MEM's device have a relatively small amplitude which can be obscured by noise introduced and amplified during the transmission of the signals to a remote test station. As such, the signals to be analyzed must be sufficiently amplified to be large enough to present a true picture of the performance characteristics of the MEM's device since a substantial portion of the signals that are analyzed have the potential to be dominated by noise.

SUMMARY OF THE INVENTION

As set forth below, the apparatus and method of the present invention for testing performance characteristics of a MEMs device having movable mechanical members overcome many of the deficiencies identified with conventional MEMs device testing procedures. In particular, the method and apparatus of the present invention operate in conjunction with testing procedures that either electrically or mechanically excite the MEMs device, such that the MEMs device outputs a relatively low amplitude electrical data signal. The method and apparatus receive the electrical data signals output by the MEMs device and amplify the signals, prior to the introduction of sufficient noise to the electrical data signal to reduce the signal to noise ("S/N") ratio below a predetermined value (i.e., prior to the introduction of significant electrical signal noise). Because the electrical data signal is amplified prior to the introduction of significant noise, subsequent electrical noise introduced into the signal does not substantially obscure the amplified electrical data signal. As such, the electrical data signal can be more reliably recovered and analyzed at the remote test station to determine the level of quality and performance of the MEMs device under test.

In addition to amplifying the electrical data signal before it propagates along the component leads and electrical wires to the remote test station, the apparatus and method of the present invention also shields the electrical data signal from electrical noise. As such, the level of electrical noise introduced into the electrical data signal as it propagates from the MEMs device to the remote test station is held to a minimum.

These and other advantages are provided, according to the present invention, by an apparatus for testing performance characteristics of a MEMs device having movable mechanical members. The apparatus includes at least one test probe that is electrically connected to the output node of one of the mechanical members of the MEMs device. The test probe receives electrical data signals from the MEMs device that were created by the excitation of the mechanical member by an electrical or mechanical input signal. The apparatus of the present invention also includes an analyzer for receiving the electrical data signals from the test probe. The analyzer then analyzes the electrical data signals to determine the performance characteristics of the MEMs device.

The test apparatus also includes a communication means extending between the test probe and the analyzer. The communication means transmits the electrical data signals from the test probe to the analyzer, where the data signals can be analyzed. Additionally, the apparatus of the present invention also includes an amplifier positioned between the test probe and the communication means. The amplifier amplifies and filters the electrical data signals prior to transmission of the electrical signals by the communication means. Importantly, the amplifier is situated at a selected distance from the test probe such that the amplifier is in close proximity to the test probe in order to amplify the electrical data signals before sufficient noise is introduced to reduce the S/N ratio to less than a predetermined level (i.e., prior to the introduction of significant electrical noise). Since the electrical data signal is amplified prior to the introduction of significant noise and prior to transmission by the communication mean, the subsequent introduction of electrical noise to the amplified electrical data signal does not obscure the electrical data signal to the same degree. Thus, the electrical data signal can be recovered and analyzed at the remote test station.

In operation, the method of the present invention includes the steps of electrically connecting the end of at least one test probe to at least one output node of one of the mechanical members of a MEMs device to be tested. The electrical test probe receives electrical data signals that are indicative of the movement of the mechanical member due to electrical or mechanical excitation by an input signal. The electrical signals are then amplified in close proximity to the test probe and prior to the introduction of sufficient noise to reduce the S/N ratio of the electrical data signals to less than a predetermined level. The amplified electrical signal is then transmitted or otherwise communicated to a remote test station and analyzed to determine the performance characteristics of the MEMs device.

In addition to using the data signal received from the output pads of the MEMs device to determine performance characteristics of the MEMs device, in some embodiments it may also be advantageous to use the output to further control the MEMs for testing. Specifically, in one embodiment of the present invention, the data signals output by the MEMs device are used as feedback to control the operating point of the MEMs device under test while analyzing the quality of output signals and stability of the MEMs device. In this embodiment, the output signal is processed by the analyzer of the remote test station and other electrical wiring connected to the MEMs device from the test station is used to control the operating point of the MEMs device.

In addition to amplifying the electrical data signals received from the MEMs device in close proximity to the test probe, the apparatus and method of the present invention also preferably shields the electrical data signals from the introduction of electrical noise. For example, in one advantageous embodiment of the present invention, the apparatus further includes a probe test station that is resistant to electromagnetic fields and other types of electrical noise that may be introduced into the data signal. In this embodiment, the MEMs device, test probe, and amplifier are located inside the probe test station. The probe test station substantially shields them from the effects of electrical noise that may deteriorate the electrical data signal.

The apparatus and method of the present invention also include other devices for substantially shielding the electrical data signals. As mentioned previously electrical component leads are susceptible to the introduction of electrical noise into the electrical data signal. For example, the amplifier may comprise an IC chip that is attached to an integrated circuit board ("probe test card") and is connected electrically to the test probe via the electrical leads of the IC chip and the trace lines or electrical leads on the probe test card. The electrical leads are elongated and thereby are susceptible to frequency noise and other types of electrical noise that can be introduced into the electrical data signal.

To remedy the problems associated with the elongated electrical leads of the IC chips, one embodiment of the present invention further includes an electrical noise resistant case, such as a flatpack, that encases the amplifier. The case has an outer shell that is resistant to electrical noise and substantially shields the amplifier from electrical noise. Further, the apparatus can include solder bumps for connecting the amplifier to the test probe and the communication means. The external solder bumps are electrically connected to the input and output terminals of the amplifier by wire bonds. By wire bonding the output and input of the amplifier to the solder bumps and attaching the solder bumps to the test probe and the communication means, elongated leads are eliminated, thereby substantially eliminating at least one source of the electrical noise introduced into the electrical data signal.

One embodiment of the present invention provides a system for testing performance characteristics of a microelectromechanical device. The test system of this embodiment further includes an excitation probe electrically connected to the input of one of the mechanical members of the MEMs device under test. The excitation probe provides electrical signals to the mechanical member, thereby causing the mechanical member to move. As the mechanical member moves, it creates and outputs an electrical data signal. The test probe of the system of the present invention is connected to the output of the mechanical member and receives the electrical data signal. The electrical data signals is then amplified in close proximity to the test probe such that the SIN ratio of the signals is still above a predetermined level. The amplified electrical data signal is then communicated to a remote test location where it is analyzed to determine the performance characteristics of the mechanical member based on the movement of the mechanical member caused by the electrical excitation of the mechanical member by the excitation probe. As such, the MEMs device may be tested using electrical excitation, as opposed to mechanical excitation, of the mechanical members since the relatively small amplitude electrical data signals are amplified prior to being obscured by excessive noise.

As outlined above and discussed in more detail below, the present invention provides an apparatus and method for testing MEMs devices using electrical or mechanical excitation. Specifically, the apparatus and method of the present invention receive electrical data signals from the output of the mechanical members of the MEMs devices and amplify the electrical data signals before sufficient noise has been introduced into the electrical data signals to reduce the S/N ratio of the signals below a predetermined S/N ratio (i.e., prior to the introduction of significant signal noise). Since the electrical data signals are amplified prior to being obscured by noise, the electrical data signals will not be obscured by noise that subsequently combines with the amplified electrical data signals. The electrical data signal can thus be reliably recovered and analyzed at a remote test station. Thus, the method and apparatus of the present invention can test the performance characteristics of a MEM's device without much, if any, degradation of the test results by noise.

DETAILED DESCRIPTION OF THE INVENTION

Figure 1:
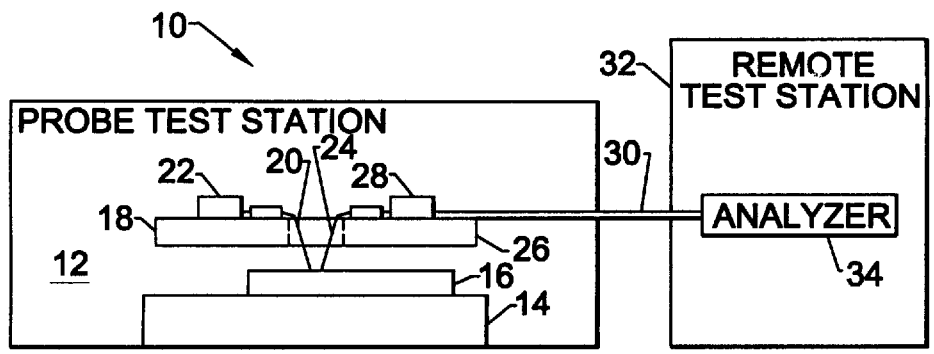
FIG. 1 is a schematic side view of a probe test station and a remote test station for testing performance characteristics of MEMs device having movable mechanical member according to one embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

As discussed above, the method and apparatus of the present invention are used in the testing of MEMs devices during manufacture to determine the level of quality and performance of the devices. There are many different types of MEMs devices used in applications such as solid state laser and fiber optic couplings, ink jet nozzles and charge plates, gyroscopes and rotating plates, magnetic disks read/write heads, and optical recording heads. These MEMs devices include mechanical members that when excited output electrical signals. These electrical signals include information that can be analyzed to determine the performance characteristics of the MEMs devices.

As an example, U.S. Pat. No. 5,488,862 to Neukermans et al. and U.S. Pat. No. 5,650,568 to Greiff et al., both disclose MEMs devices that can be tested utilizing the apparatus and method of the present invention, and as such, their contents are incorporated herein by reference. Specifically, the Greiff et al. '568 patent discloses a MEMs gyroscope device having a wheel assembly, or rotor made from etchable material that is connected to input and output electrodes. To test the wheel assembly using electrical excitation, electrical signals are applied to the input electrodes. These electrical signals create electric and/or magnetic fields to act on the wheel assembly such that the wheel assembly moves. The movement of the wheel assembly generates an electrical signal on the output electrodes of the MEMs device. By analyzing these electrical data signals, the level of quality and performance of the gyroscope may be determined.

As discussed above, however, the electrical signals output by the MEMs device due to electrical excitation may have a small amplitude, such as 10 microvolts or less. As such, electrical noise introduced into the electrical data signals as they propagate to the remote test station may quickly obscure the electrical data signal. To remedy the problems associated with testing MEMs devices, the apparatus and method of the present invention amplify the electrical data signals output by the MEMs device due to either electrical or mechanical excitation prior to the introduction of sufficient noise to reduce the S/N ratio of the electrical data signals below a predetermined S/N ratio (i.e., prior to the introduction of unacceptable levels of electrical noise).

Additionally, the apparatus and method of one embodiment of the present invention provides devices and methods that reduce the electrical noise introduced into the input of the amplifier. Also, the apparatus and method of one embodiment of the present invention provide devices for shielding the test probe, MEMs device, test probe card, amplifier, and associated wiring from electrical signal noise, thereby preventing the introduction of electrical signal noise into the electrical data signal as the signal propagates from the output of the MEMs device to the remote test station.

With reference to FIG. 1, one embodiment of the apparatus for testing performance characteristics of a MEMs device having movable mechanical members is illustrated. The apparatus 10 of this embodiment includes a probe station 12 having a wafer chuck 14 for supporting a wafer 16 comprising a plurality of MEMs devices to be tested. Located above the wafer is a test probe card 26 containing excitation probes 20 and excitation electronics 22 for delivering an excitation electrical signal to the MEMs devices to be tested on the wafer.

The apparatus 10 of the present also includes test probes 24 for receiving electrical data signals from the MEMs device. At lease one test probe is connected to the probe test card 26. The apparatus also includes an amplifier 28, located on the probe test card, for receiving and amplifying the electrical data signals. The apparatus further includes communication means 30, connected to the output of the amplifier, for transmitting the electrical data signals. The apparatus also has a remote test station 32 connected to the communication means including an analyzer 34 for analyzing the electrical data signals output by the MEMs device.

Important to the apparatus of the present invention is the placement of the amplifier 28. Specifically, the amplifier is placed in close proximity to the test probe 24 such that the amplifier amplifies the electrical data signals before sufficient noise has been introduced into the electrical data signals to reduce the S/N ratio of the electrical data signals below a predetermined level, such as 10 dB. As such, electrical signal noise introduced into the electrical data signals as they propagate from the test probe to the remote test station will not significantly obscure the electrical data signals since the electrical data signals now have a substantially large amplitude relative to most sources of noise.

Figure 2:
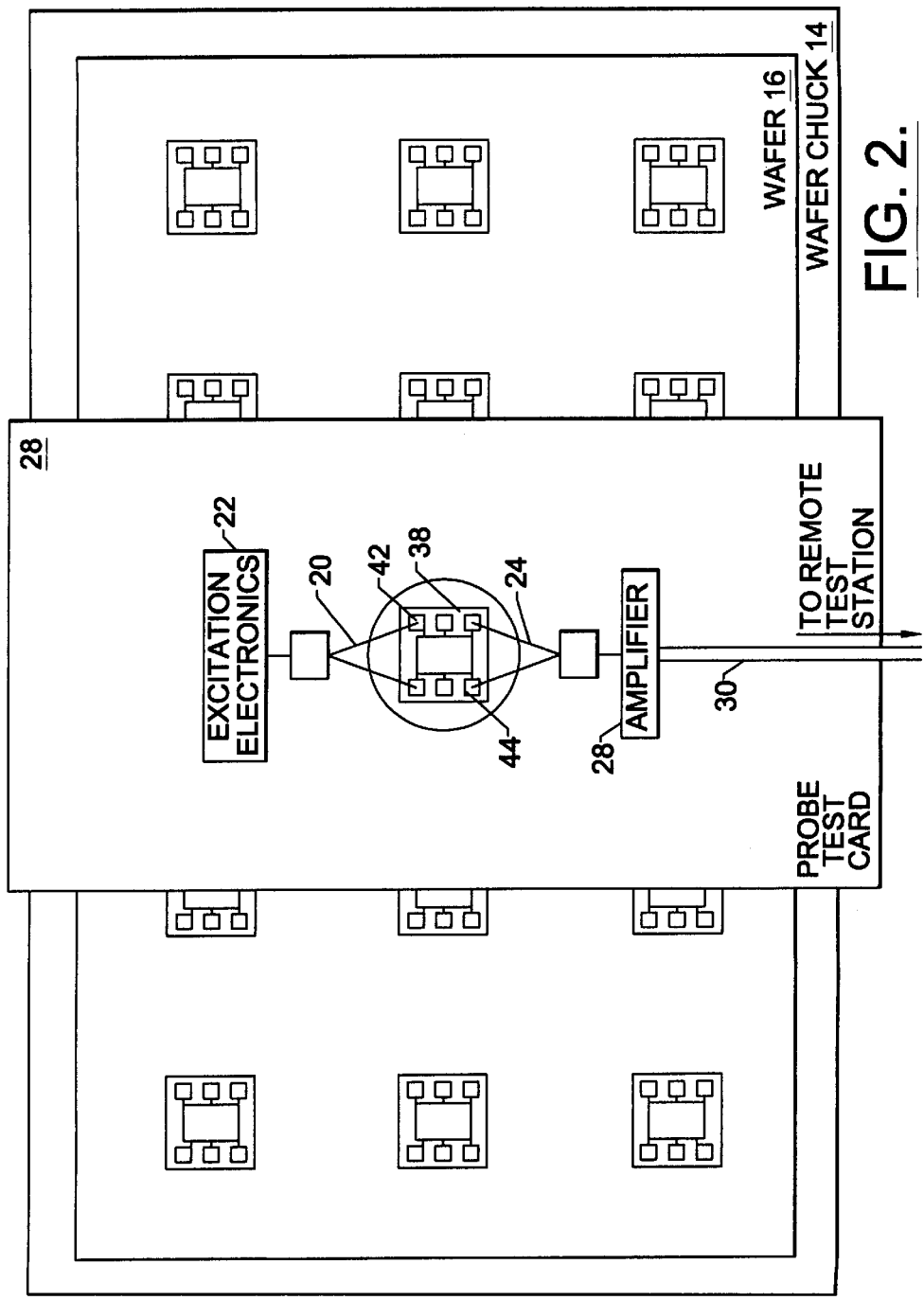
FIG. 2 is a schematic top plan view of the wafer, MEMs device, and probe test card for testing performance characteristics of a MEMs device having movable mechanical members according to one embodiment of the present invention.

With reference to FIG. 2, the connection of the excitation 20 and the test 24 probes to the MEMs device is illustrated in greater detail. As shown, the wafer 16 generally includes a plurality of MEMs devices to be tested, such as 300 to 2500 or more depending on the wafer size. Each of these MEMs devices 38 includes probe pads that are electrically connected to the various moveable mechanical members, not shown, of the respective MEMs device. To test the MEMs device, the excitation probes 20 are connected to the input probe pads 42 of the MEMs device and the test probes 24 are connected to the output probe pads 44. The probes may be connected manually or by use of an automated system. In this configuration, the probe test station can test all of the MEMs devices without separating each MEMs device from the wafer by merely moving the connections of probes to the different MEMs devices.

Figure 3:
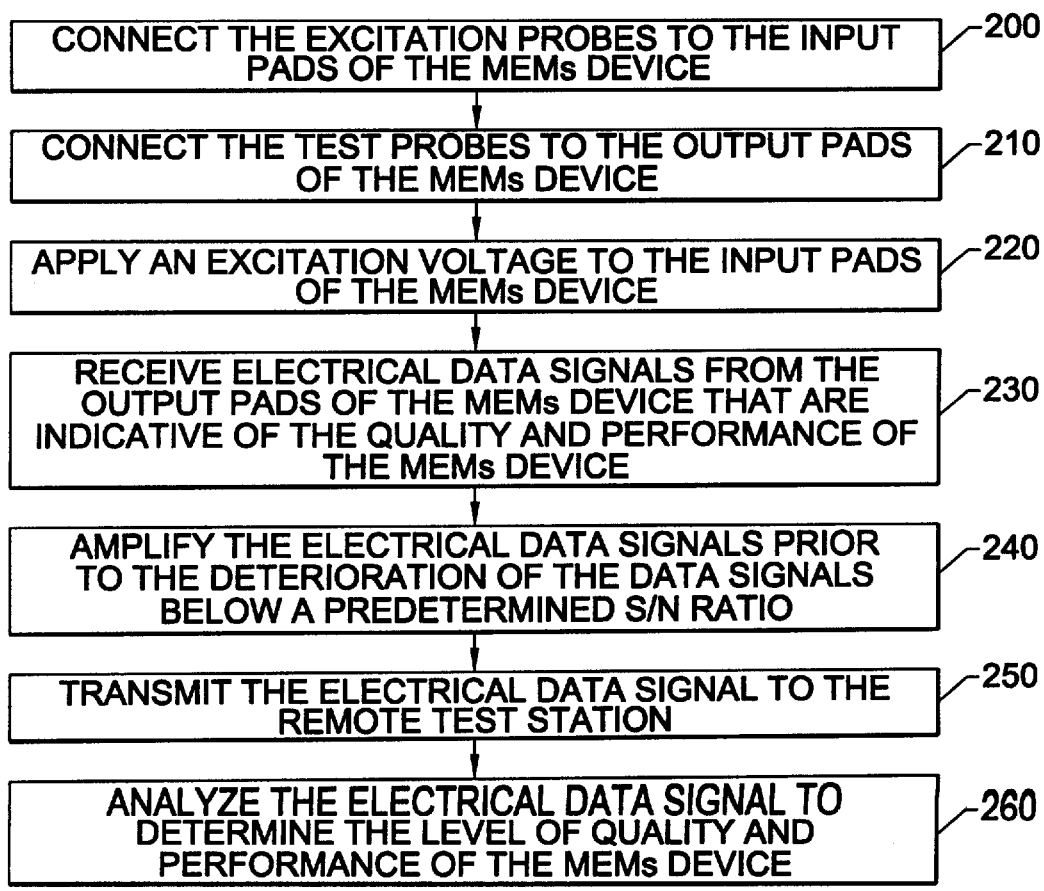
FIG. 3 is an operational block diagram of a method for testing performance characteristics of a MEMs device having movable mechanical members according to one embodiment of the present invention.

With reference to FIGS. 1, 2, and 3, the operation of the present invention will be more fully described. Specifically, to test the quality and performance of a MEMs device, the excitation probes 20 of the test probe card 26 are connected to the input probe pads 42 of the MEMs device. (See step 200). The test probes 24 are then connected to the output probe pads 44 of the MEMs device. (See step 210). After the probes have been connected to the MEMs device, the excitation electronics 22 on the test probe card are driven to output a predetermined output test voltage to the excitation probe, which, in turn, is provided to the input pads of the MEMs device. (See step 220).

In response to the input test signal, the mechanical members, not shown, of the MEMs device experience movement. The movement of the mechanical members in response to the predetermined input signal generates electrical data signals that are output to the output pads 44. These electrical data signals provide information concerning the quality and performance of the MEMs device. The test probes 24 receive these electrical data signals and provide them to the amplifier 28. (See step 230). The amplifier receives and amplifies the electrical data signals prior to the introduction of electrical noise that would reduce the S/N ratio of the electrical data signals to below a predetermined value. (See step 240).

After the electrical data signals have been amplified, they are transmitted via the communication means 30 to the remote test station 32. (See step 250). At the remote test station, the analyzer 34 receives and analyzes the electrical data signals based on the input signal to determine the level of quality and performance of the various mechanical members of the MEMs device, as known to those skilled in the art. (See step 260). As such, the MEMs device can be tested with electrical excitation test procedures, despite the relatively small amplitude electrical data signal output by the MEMs device. Importantly, the electrical data signal can be recovered and analyzed by the analyzer because the amplifier is placed in close proximity to the test probe, such that the electrical data signal is amplified prior to the introduction of electrical noise that would reduce the S/N ratio of the electrical data signal below a predetermined S/N ratio.

As discussed above, the apparatus of the present invention utilizes excitation and test probes to interface with the input and output pads of the MEMs device. These test probes are usually elongated and have a tip for contacting the test pads of the MEMs device. Additionally, the test probes are connected to a respective probe test card and may have a shielding material along their shaft to prevent the introduction of electrical noise that would disadvantageously combine with the electrical data signal. Further, it must be understood that the test probe card may contain any number of excitation and test probes and that it may have excitation and test probes connected to more than one MEMs device at a time.

The apparatus of the illustrated embodiment excites the MEMs device with electrical signals. However, it must be understood that the present invention is not limited to electrical excitation of the MEMs device. Specifically, the apparatus of the present invention can be used with any MEMs device test procedure that produces relatively small amplitude electrical data signals that could be easily corrupted with noise. Although this problem usually occurs in electrical excitation test procedures, there may be mechanical excitation procedures that produce a small amplitude electrical data signal that may be obscured by the later introduction of the electrical signal noise.

As mentioned above, the apparatus of the present invention includes excitation electronics for producing an electrical signal to excite the MEMs device. The excitation electronics may be any configuration of electrical components for producing the electrical excitation signal and can be controlled by a microprocessor or similar device. Importantly, the excitation electrical signal provided by the electronics to the MEMs device is typically a predetermined signal that is selected to promote a desired movement or reaction in the mechanical members of the MEMs device. Additionally, the electronic excitation signal may be either in the form of an analog signal or a series of pulses. Although the excitation electronics are shown on the probe card, it is understood that the electronics may be either on the probe card or in a remote location such as the remote test station.

In a typical embodiment of the present invention, the excitation electrical signal typically has a magnitude of 2 to 10 volts that, in turn, causes the mechanical members of the MEMs device to move in the range of 1 to 20 micrometers (zero to peak) and produce an output electrical data signal in the range of 0.4 to 1000 microvolts (zero peak to peak) for present device designs.

Additionally, the amplifier of the present invention may be any desired amplifier for amplifying the electrical data signal. Typically, however, the amplifier comprises a charge amplifier for amplifying very small charge signals having a charge of approximately $10^{-17}$ coulombs to a voltage level sufficient for analysis. Charge amplifiers are commercially available. For instance, a charge amplifier used in one embodiment of the present invention is a TLC2272 chip and is available through Texas Instruments located in Dallas, Tex.

As mentioned above, the apparatus of the present invention includes communication means for transmitting the electrical data signal from the amplifier to the remote test station. In a typical embodiment, the communication means comprises an electrical wire connecting the output of the amplifier with the remote test station. However, in some embodiments the communication means may comprise an RF or infrared transmitter or the like for transmitting the data signal to remote test station. Additionally, in some embodiments of the present invention, the communication means comprises a coaxial cable or a twisted-shielded pair of wires that is resistant to the introduction of electrical noise into the electrical data signal. In a preferred embodiment, coaxial cable available from Lakeshore Cryotronics, located in Westerville, Ohio provides desired shielding qualities.

As discussed previously, the present invention includes a remote test station for receiving and analyzing the electrical data signals received from the output of the MEMs device. In addition to the analyzer shown in the above embodiments, the remote test station may include other components for analyzing the electrical data signal. For instance, the remote test station may include amplifiers for further amplifying the signal, filters for conditioning the signals, and display units for displaying the information to the user. Additionally, the analyzer may comprise many different types of devices for analyzing the electrical data signals. For instance, in some embodiments the analyzer may comprise a microprocessor controlled by a software program. In other embodiments, the analyzer may comprise oscilloscopes, other types of analyzers, or closed loop analog and analog/digital control systems.

In addition to using the data signal received from the output pads of the MEMs device to determine performance characteristics of the MEMs device, in some embodiments it may also be advantageous to use the output to further control the MEMs for testing. Specifically, in one embodiment of the present invention, the data signals output by the MEMs device are used as feedback to control the operating point of the MEMs device under test while analyzing the quality of output signals and stability of the MEMs device. In this embodiment, the output signal is processed by the analyzer of the remote test station and other electrical wiring connected to the MEMs device from the test station is used to control the operating point of the MEMs device.

As mentioned above, the placement and connection of the amplifier relative to the test probe is important to the apparatus and method of the present invention. In this regard, a major problem associated with the electrical excitation of the MEMs device is the relatively small amplitude electrical data signal that is output by the MEMs device. As discussed above, charge amplifiers are typically used to amplify these low amplitude signals. Although charge amplifiers can amplify very low amplitude signals, they also have undesirable characteristics that can affect the amplification of the electrical data signal. Specifically, charge amplifiers are sensitive to electrical interconnect capacitance at the input of the amplifier. This sensitivity to electrical interconnect capacitance results from two effects, namely, 1) electrical capacitance to a zero potential or equal potential surface (i.e., input capacitance) and 2) electrical capacitance to any spurious signal source (e.g., 60 Hz power source, test system noise, etc.).

As an example of input capacitance, typical operational amplifiers have an input random noise component that acts as a voltage source at the input. Amplification of this noise component may obscure the input data signal that is to be amplified. Operational amplifiers configured as charge amplifiers are particularly sensitive to input capacitance because the input noise is multiplied by the ratio of charge gain capacitance to input capacitance, and input capacitance can exceed charge gain capacitance by a factor of 10 due to poor connection between the input of the amplifier and the test probe.

Spurious signal sources can also introduce noise into the data signal. In a test environment, there are a number of sources of very large amplitude and undesirable voltage signals generated by manufacturing machinery, vacuum pumps, and control signals. Capacitance between these spurious sources and the charge amplifier input can also introduce electrical signal noise into the electrical data signal received from the MEMs device. Further, the test probe and the electrical wiring between the output of the MEMs device and the input of the amplifier are susceptible to reception of this spurious electrical noise. This electrical signal noise, once amplified, can further obscure the electrical data signal.

To address the affects of the introduction of electrical noise caused by input capacitance and spurious signal noise, the amplifier of the apparatus of the present invention is placed in close proximity to the test probe. In this configuration, there is less electrical wiring between the test probe and the amplifier to receive electrical noise that is introduced into the electrical data signal. Specifically, the amplifier is placed at a distance from the test probe such that the electrical data signal is amplified while the S/N ratio of the electrical data signal is still above a predetermined level and has not been irretrievably obscured by electrical noise.

In general, the amplifier may be placed at any selected distance from the test probe that will allow the amplifier to amplify the electrical data signals prior to the introduction of unacceptable levels of electrical noise. In a typical embodiment, the amplifier is placed at a distance from the test probe such that the electrical data signal is amplified while the S/N ratio is above 10 dB. In preferred embodiments, the amplifier is placed at a distance from the test probe such that the electrical data signal is amplified while the S/N ratio is above 15 dB and, in one advantageous embodiment, while the S/N ratio is above 17 dB.

In one embodiment of the present invention, the amplifier is directly connected to the test probe, thereby eliminating any intervening wiring or electrical traces between the test probe and the input of the amplifier. In a further embodiment, the amplifier is positioned on the test probe near the tip of the test probe that is connected to the output of the MEMs device. As such, the problems of susceptibility to noise by the test probe are reduced, if not eliminated, because the electrical data signal does not propagate along the shaft of probe before being amplified.

In addition to placing the amplifier in close proximity to the test probe, one embodiment of the present invention also provides means to limit the introduction of electrical noise due to input capacitance and spurious signal noise. Specifically, in one embodiment of the present invention, the amplifier is placed in an electrical noise resistant packaging system to prevent the introduction of electrical noise to the input of the amplifier. This noise resistant packaging system is commonly referred to as a flatpack. Flatpacks are available commercially through Olin Aegis, located in New Bedford, Mass. A flatpack has an outer surface formed of ceramic, kovar, metalization such as gold that is resistant to the introduction of electrical noise. Importantly, the flatpack also includes other features that are advantageous for excluding electrical signal noise from introduction into the input of the amplifier, as described below.

In typical applications of amplifiers, the amplifiers constitute discrete IC chips. These IC chips have electrical lead wires for connecting the chip to the traces on the probe card. These electrical lead wires are elongated, and as such, are susceptible to electrical noise. The flatpack on the other hand, eliminates these elongated lead wires. Specifically, flatpack devices include small solder bumps on the bottom of the flatpack for connecting to the electrical traces of the probe test card. Additionally, the flatpack includes pinouts that are in close proximity to the input and outputs of the amplifier. The pinouts are connected to the input and output of the amplifier via a wire bonding technique that creates a small electrical wire bond. This small wire bond is not elongated and thus, is less susceptible to the introduction of electrical noise. The solder bump connection to the probe test card, the use of wire bonding techniques, and the shielding provided by the flatpack further reduce the problems associated with introduction of electrical signal noise due to elongate electrical leads.

Figure 4:
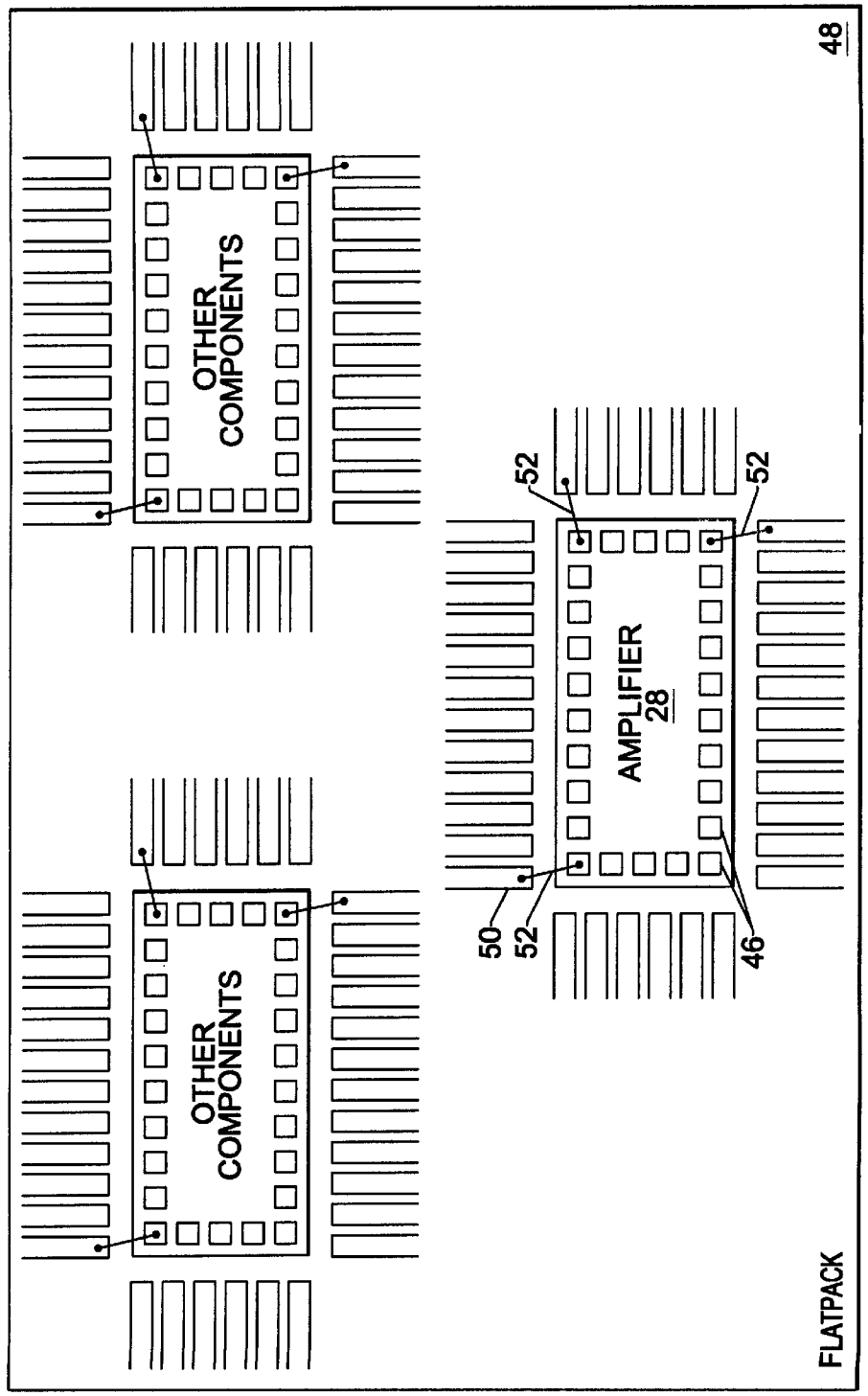
FIG. 4 is a schematic bottom plan view of an amplifier inserted in a flatpack according one embodiment of the present invention.

With reference to FIG. 4, the placement of the amplifier in the flatpack is illustrated in detail. Specifically, FIG. 4 is a bottom view of the amplifier 28 having electrical pads 46 connected to the input and output of the amplifier 28. The amplifier is placed inside the flatpack 48. The flatpack includes a plurality of electrical leads 50 for connecting to the electrical pads of the amplifier. Thin wire bonds 52 are formed by a wire bonding process that electrically connects the inputs and outputs pads 46 of the amplifier 28 to the leads 50 of the flatpack.

After the amplifier has been wire bonded to the flatpack, an upper casing, not shown, is placed over the amplifier and the amplifier is essentially encased in the flatpack to protect the electrical wire bonds, pads, and leads from the introduction of electrical noise. Additionally, the external electrical solder bumps, which are electrically connected via the internal leads to the amplifier, are then connected to the wire traces of the probe test card, thereby connecting the amplifier to the test probe and the communication means.

In addition to placing the amplifier in close proximity to the test probe and placing the amplifier in a flatpack, the apparatus and method of the present invention also provide other devices for shielding the various components from the effects of electrical noise. For instance, in some embodiments, the probe test station comprises a Faraday cage that surrounds the MEMs device, test probe, probe test card, and the amplifier. This Faraday cage shields the components from spurious electrical signal noise emanating from the various test equipment in the laboratory. A similar Faraday cage may also surround the remote test station to shield the analyzer and the other various electronics from electrical signal noise. Additionally, as discussed previously, in some embodiments, the communication means comprises either a coaxial cable or a twisted-shielded pair of electrical wires that shields the electrical data signal from electrical signal noise.

As discussed above, the present invention places the amplifier in close proximity to the test probe such that the electrical data signal from the MEMs device is amplified prior to the signal deteriorating to a S/N ratio below a predetermined level. Additionally, the apparatus and method of the present invention places the amplifier in a flatpack to reduce the introduction of electrical noise into the electrical data signal received from the MEMs device.

Provided below are the calculations to determine the actual S/N ratio of an electrical data signal prior to amplification by an amplifier in one specific embodiment of the present invention. In this embodiment, the amplifier is placed in close proximity to the test probe and is encased in a flatpack. The test station is used to test gyroscopes, such as detailed in the Neukermans et al. '862 patent.

As can be seen from the calculations, the electrical data signal has a S/N ratio of 17.4 dB before it is amplified. Importantly, the example illustrates that varying the distance between the amplifier and the test probe will substantially define the performance of the test station. As would be suspected, an increase in the distance that the electrical data signal must travel before amplification reduces the effectiveness of the test station.

Calculations:
Maximum level of noise due to capacitive loading on the inputs of the amplifier:
Specification:
1) Minimum Resolution if the Gyroscope is 0.05 degree/second rms in 100 Hz bandwidth (⅒ of 0.5 degree/second rms requirement)
2) Required S/N ratio of electrical data signal input into the amplifier is 10 dB.
3) Minimum scale factor of the amplifier 8 $\mu$Volt/degree/second
4) Minimum resolvable voltage on the amplifier output= minimum resolution×scale factor
=0.5 deg./sec.×8 $\mu$Volt/deg./sec.
=0.4 $\mu V_{rms}$ (minimum resolvable voltage on amplifier output)
Noise=0.4 $\mu V_{rms}$
Amplifier noise gain:
Input Load Capacitance/Feedback Capacitance:
Capacitance at Input:
1) MEMs Device=1 pF (measured)
2) Flatpack=5 pF hybrid (estimated)
3) Amplifier Input=5 pF (specification)
4) Probe Tip=2 pF (estimated)

5) Wire Traces/Leads=2 pF (estimated)
Sum=15 pF
Feedback Capacitance of Amplifier:
1) Feedback Capacitor: 2.5 pF
Gain on Amplifier:
Gain:=Input Cap./Feedback Cap.=15 pF/2.5 pF=6
Signal to noise Calculation:
Amplifier Noise:
1) Low noise amplifier output specification (noise feeds around to the input via feedback)=9 nV/rtHz
2) Bandwidth=100 Hz
3) Amplifier Noise for 100 Hz Bandwidth=9 nV/rtHz×rt 100 Hz=90 nV$_{rms}$ Noise Total:
=Gain×Noise
=6×90 nV$_{rms}$
=0.540 $\mu$V$_{rms}$
S/N ratio Calculation:
=20 log (Signal/Noise)
=20 log (4 $\mu$V$_{rms}$/0.540 $\mu$V$_{rms}$
=20 log (7.407)
=20 (0.86967)
=17.4 dB S/N ratio Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. An apparatus for testing performance characteristics of a microelectromechanical device, said microelectromechanical device having movable mechanical members, wherein said apparatus comprises:

at least one test probe having one end in operable electrical communication with at least one of the movable mechanical members of the microelectromechanical device for receiving electrical signals indicative of the movement of the movable mechanical member;

an analyzer for receiving the electrical signals from said test probe at a location remote from the microelectromechanical device, wherein said analyzer analyzes the electrical signals to determine the performance characteristics of the microelectromechanical device;

communication means for transmitting the electrical signals from the test probe to the analyzer; and an amplifier in operable electrical communication with said test probe and said communication means, wherein said amplifier is in close proximity to said test probe such that said amplifier amplifies the electrical signals prior to transmission of the electrical signals by said communication means such that the electrical signals are amplified before sufficient noise has been introduced into the electrical signals to reduce a signal to noise ratio of the electrical signals to less than 10 decibels.

2. An apparatus according to claim 1, wherein said communication means comprises an electrically conductive cable having a shielding layer that prevents the introduction of electrical noise into the electrical signal.

3. An apparatus according to claim 1, wherein said amplifier is in direct electrical connection with said test probe so as to minimize the introduction of electrical noise into the electrical signals received by said test probe.

4. An apparatus according to claim 1, wherein said amplifier is located on said test probe in close proximity to the end of the test probe that is in electrical communication with the mechanical member so as to minimize the introduction of electrical noise into the electrical signals received by said test probe.

5. An apparatus according to claim 1 further comprising a probe station resistant to electromagnetic fields, wherein said microelectromechanical device, test probe, and amplifier are located inside said probe station and are substantially shielded from the affects of electromagnetic fields.

6. An apparatus according to claim 1, further comprising an electromagnetic field resistant case for encasing said amplifier such that said amplifier is substantially shielded from the effects of electromagnetic fields.

7. An apparatus according to claim 6, wherein said electromagnetic field resistant case comprises pinout leads for connecting said amplifier to said test probe and said communication means, wherein respective pinout leads are wirebonded to input and output terminals of said amplifier such that electrical noise is not introduced into said electrical signals.

8. An apparatus according to claim 1, further comprising at least one excitation probe operably electrically connected to at least one of said mechanical members for providing an electrical signal to said mechanical member, thereby causing the mechanical member to move and generate electrical output.

9. An apparatus according to claim 8, wherein said analyzer determines the performance characteristics of said mechanical member based on the movement of the mechanical member caused by the electrical excitation of the mechanical member by said excitation probe.

10. An apparatus according to claim 9, wherein said amplifier further uses the electrical signals received from said test probe as feedback and adjusts the electrical signals provided by said excitation probe to the mechanical member of the microelectromechanical device based on the electrical signals received from said test probe.

11. An apparatus according to claim 8, wherein said excitation probe provides an electrical signal to said mechanical member that causes said mechanical member to move a distance in the range of 1 to 20 micrometers (zero to peak).

12. An apparatus according to claim 11, wherein said test probe detects an electrical signal in the range of 0.4 to 1000 microvolts in response to the movement of said mechanical member.

13. An apparatus according to claim 12, wherein said amplifier is a charge amplifier.

14. An apparatus for determining performance characteristics of a plurality of microelectromechanical devices located on a common wafer, wherein each microelectromechanical device has at least one movable mechanical member, wherein said apparatus comprises:

at least one test probe having one end in operable electrical communication with an output of at least one of the movable mechanical members of at least one of the microelectromechanical devices for receiving electrical signals indicative of the movement of the movable mechanical member;

an excitation probe connected to an input of at least one of the movable mechanical members of at least one of the microelectromechanical devices, wherein said excitation probe provides an electrical signal to the movable mechanical member, thereby causing the movable mechanical member to move and generate electrical output;

an analyzer for receiving the electrical signals from said test probe at a location remote from the microelectromechanical device, wherein said analyzer analyzes the electrical signals to determine the performance characteristics of the microelectromechanical device;

communication means for transmitting the electrical signals from the test probe to the analyzer; and an amplifier in operable electrical communication with said test probe and said communication means, wherein said amplifier is in close proximity to said test probe such that said amplifier amplifies the electrical signals prior to transmission of the electrical signals by said communication means such that the electrical signals are amplified before sufficient noise has been introduced into the electrical signals to reduce a signal to noise ratio of the electrical signals to less than 10 decibels, and wherein said analyzer determines the performance characteristics of the microelectromechanical device without initially separating the microelectromechanical device from the wafer.

15. An apparatus according to claim 14, wherein an excitation probe and a test probe are connected to at least one of the movable mechanical members of each of the plurality of the microelectromechanical devices at the same time, wherein said amplifier separately amplifies the electrical signals received from each of said test probes such that the electrical signals are amplified before sufficient noise has been introduced into the electrical signals to reduce the signal to noise ratio to less than 10 decibels, and wherein said analyzer analyzes the electrical signals at the remote location to determine the performance characteristics of each microelectromechanical device without initially separating the microelectromechanical devices from the wafer.

* * * * *

UNITED STATES PATENT AND TRADEMARK OFFICE
CERTIFICATE OF CORRECTION

PATENT NO.   : 6,232,790 B1                                         Page 1 of 1
DATED        : May 15, 2001
INVENTOR(S)  : Bryan et al.

It is certified that error appears in the above-identified patent and that said Letters Patent is hereby corrected as shown below:

<u>Title page,</u>
<u>Item [57] ABSTRACT,</u>
Line 8, "or" should read -- for --;
Line 11, "a so" should read -- also --;
Line 14, "at" should read -- that --.

<u>Column 14,</u>
Line 13, "affects" should read -- effects --.

Signed and Sealed this

Eighteenth Day of December, 2001

Attest:

Attesting Officer

JAMES E. ROGAN
Director of the United States Patent and Trademark Office